United States Patent
Hsu et al.

(10) Patent No.: US 9,735,065 B2
(45) Date of Patent: Aug. 15, 2017

(54) SYSTEMS AND METHODS OF LOCAL FOCUS ERROR COMPENSATION FOR SEMICONDUCTOR PROCESSES

(71) Applicant: TAIWAN SEMICONDUCTOR MANUFACTURING CO., LTD., Hsin-Chu (TW)

(72) Inventors: Chia-Hao Hsu, Hsinchu (TW); Pei-Cheng Hsu, Taipei (TW); Chia-Ching Huang, Su-ao Township (TW); Chih-Ming Chen, Hsinchu (TW); Chia-Chen Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 101 days.

(21) Appl. No.: 14/656,754

(22) Filed: Mar. 13, 2015

(65) Prior Publication Data
US 2015/0187663 A1   Jul. 2, 2015

Related U.S. Application Data

(63) Continuation of application No. 13/671,581, filed on Nov. 8, 2012, now Pat. No. 9,003,337.

(51) Int. Cl.
| | |
|---|---|
| *G06F 17/50* | (2006.01) |
| *H01L 21/66* | (2006.01) |
| *H01L 21/02* | (2006.01) |
| *G03F 1/00* | (2012.01) |
| *H01L 21/311* | (2006.01) |
| *H01L 21/3205* | (2006.01) |
| *H01L 21/321* | (2006.01) |
| *H01L 21/3213* | (2006.01) |

(52) U.S. Cl.
CPC ............... *H01L 22/12* (2013.01); *G03F 1/00* (2013.01); *G06F 17/5068* (2013.01); *H01L 21/02697* (2013.01); *H01L 21/31144* (2013.01); *H01L 21/3212* (2013.01); *H01L 21/32051* (2013.01); *H01L 21/32133* (2013.01)

(58) Field of Classification Search
USPC ......................................................... 716/54
See application file for complete search history.

(56) References Cited

U.S. PATENT DOCUMENTS

| | | | |
|---|---|---|---|
| 5,883,703 A | 3/1999 | Knirck et al. | |
| 2003/0064296 A1 | 4/2003 | Yen | |
| 2003/0229868 A1 | 12/2003 | White et al. | |
| 2006/0110837 A1* | 5/2006 | Gupta | G03F 1/144 438/14 |
| 2012/0194792 A1* | 8/2012 | Sapp | G03F 7/70066 355/55 |
| 2013/0065328 A1* | 3/2013 | Wang | G03F 7/70341 438/8 |

\* cited by examiner

*Primary Examiner* — Mohammed Alam
(74) *Attorney, Agent, or Firm* — Duane Morris LLP

(57) ABSTRACT

A system and method of compensating for local focus errors in a semiconductor process. The method includes providing a reticle and applying, at a first portion of the reticle, a step height based on an estimated local focus error for a first portion of a wafer corresponding to the first portion of the reticle. A multilayer coating is formed over the reticle and an absorber layer is formed over the multilayer coating. A photoresist is formed over the absorber layer. The photoresist is patterned, an etch is performed of the absorber layer and residual photoresist is removed.

16 Claims, 12 Drawing Sheets

Step high 60 nm

Step high 20 nm

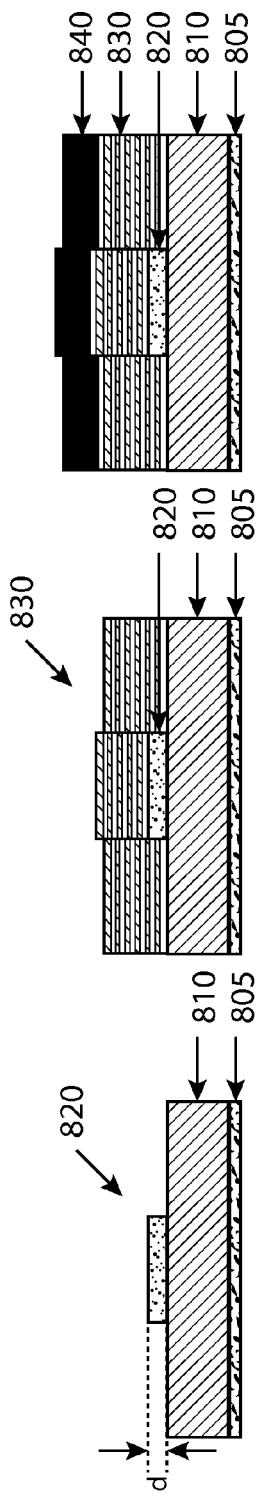
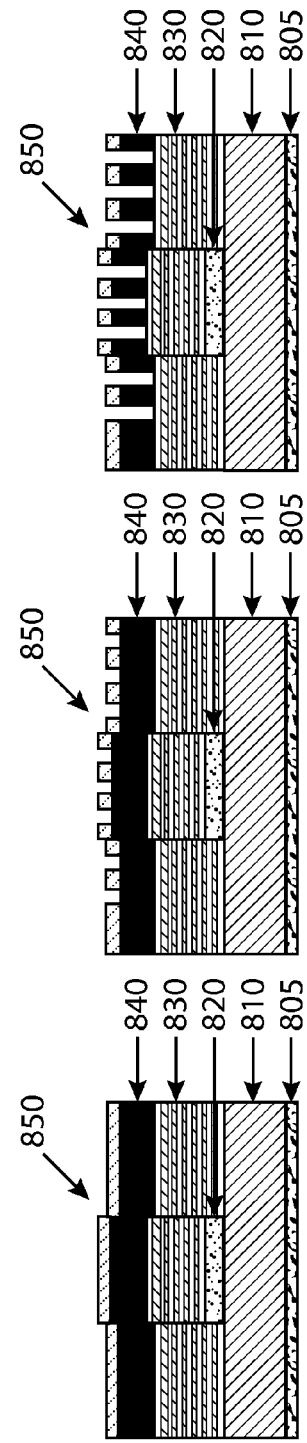
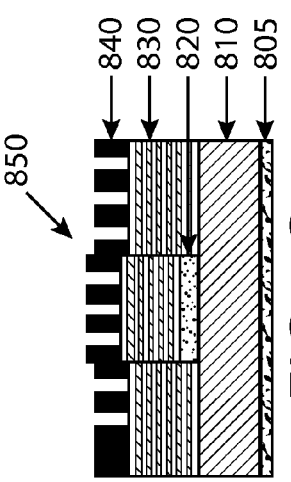

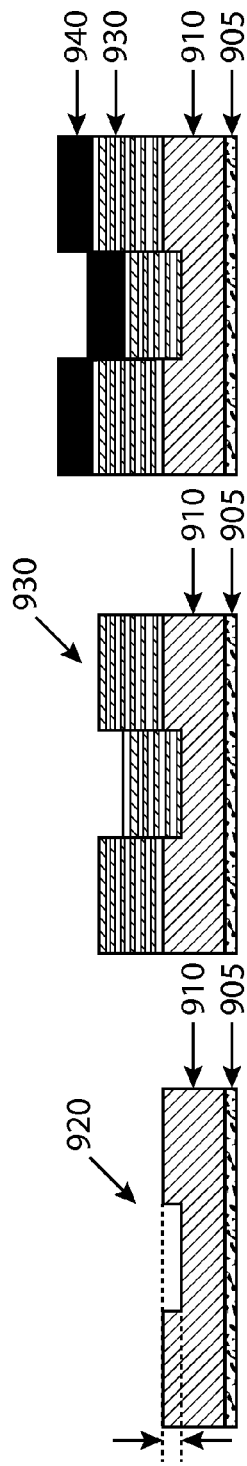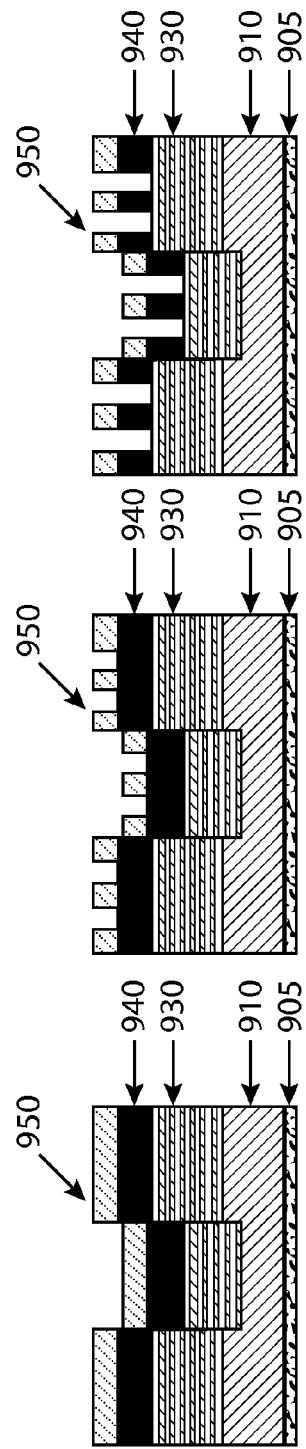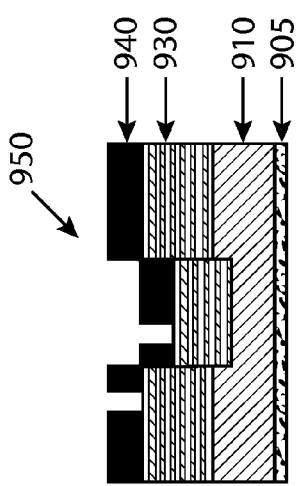

SYSTEMS AND METHODS OF LOCAL FOCUS ERROR COMPENSATION FOR SEMICONDUCTOR PROCESSES

CROSS-REFERENCE TO RELATED APPLICATIONS

This application is a continuation application of and claims priority to U.S. patent application Ser. No. 13/671,581, filed on Nov. 8, 2012, the entirety of which is herein incorporated by reference.

FIELD OF THE INVENTION

The present disclosure is directed generally to semiconductor processes and more particularly to systems and methods of compensating for local focus errors in semiconductor processes.

DESCRIPTION OF THE RELATED ART

Photolithographic processing is critical to the fabrication of integrated circuits (IC). As sizes of active circuit elements in ICs continues to decrease, with corresponding increases in the pattern densities of circuits in these ICs, improving the resolution and focus of pattern images is of paramount importance. Soft X-ray microlithography techniques, such as extreme ultra-violet (EUV) microlithography, are being considered to offer improved resolution of pattern elements having 70 nm or smaller pattern widths.

Semiconductor processes can induce varied topography across semiconductor wafers which can result in focus error at portions of the semiconductor wafers. Failing to achieve acceptable focus of the pattern during the photolithographic process can result in pattern defects, device defects and even device and/or chip failure which adversely affect yield. These defects can also require chip redesign which is costly and time-consuming.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

FIGS. 8A-8G are sectional views of a reticle illustrating a method of compensating for local focus errors in a semiconductor process according to embodiments of the present disclosure.

FIGS. 9A-9G are sectional views of a reticle illustrating a method of compensating for local focus errors in a semiconductor process according to some embodiments.

DETAILED DESCRIPTION OF THE EXAMPLES

Figure 1:
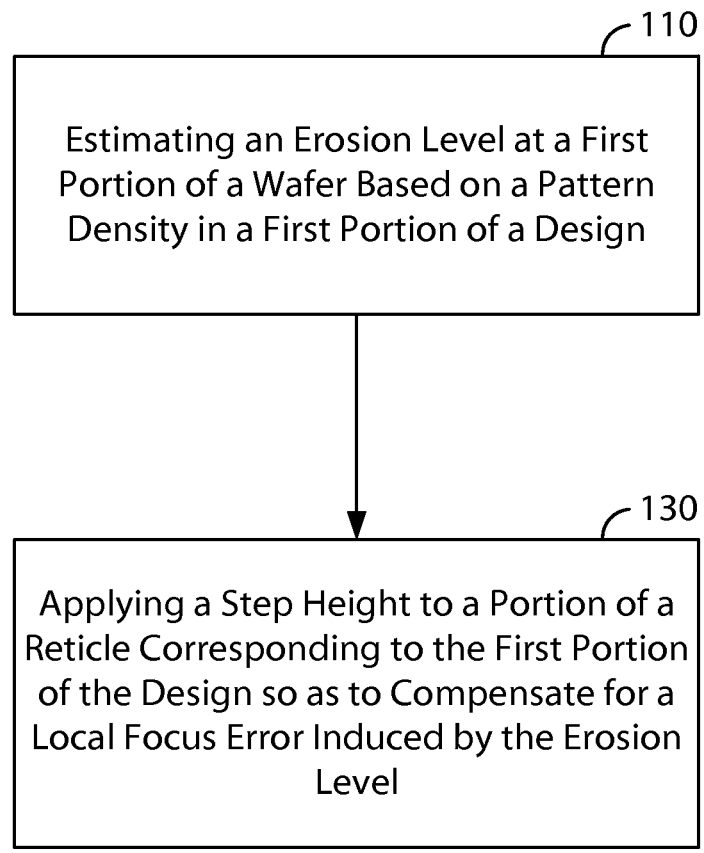
FIG. 1 is a flow chart illustrating a method of compensating for local focus errors in a semiconductor process according to embodiments of the present disclosure.

With reference to the Figures, where like elements have been given like numerical designations to facilitate an understanding of the drawings, the various embodiments of a system and method of compensating for a local focus error in a semiconductor process are described. The figures are not drawn to scale.

The following description is provided as an enabling teaching of a representative set of examples. Many changes can be made to the embodiments described herein while still obtaining beneficial results. Some of the desired benefits discussed below can be obtained by selecting some of the features or steps discussed herein without utilizing other features or steps. Accordingly, many modifications and adaptations, as well as subsets of the features and steps described herein are possible and can even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components.

As used herein, use of a singular article such as "a," "an" and "the" is not intended to exclude pluralities of the article's object unless the context clearly and unambiguously dictates otherwise.

Improved systems and methods of compensating for local focus errors in semiconductor processes are provided. The systems and processes described herein are not limited to any specific semiconductor process technology, production area, equipment, technology node, fabrication tool, wafer size, etc. The inventors have developed a system and method of local focus error compensation that is capable of compensating for erosion resultant from performance of various semiconductor processes in order to improve yield and decrease costs.

The inventors have observed that performance of various semiconductor processes can result in erosion at one or more layers deposited over a semiconductor substrate. In some embodiments, the one or more layers can include, but are not limited to, a back end of line layer, a contact layer, a metal layer, a via layer, a low-k dielectric layer, or an oxide layer. The observed erosion results in varying topography along a surface of a semiconductor wafer. Topography refers to the variation in height (in a Z-direction) above a surface of a substrate. In some embodiments, a planarization step, such as a chemical mechanical polish (CMP) process is performed to make a surface of the substrate smooth, such that a subsequent layer of the semiconductor can be formed. Ideally, the planarization step makes the substrate completely smooth. However, the inventors have observed that, in practice, performance of various CMP processes can result in erosion at one or more layers deposited over a semiconductor wafer.

The inventors have determined that an erosion depth at any portion of a wafer generally increases as pattern density increases for a corresponding portion of the design. The inventors have also determined that this observed erosion causes a portion of the substrate to lie outside the focal plane of the lithography tool, which introduces a local focus error into a lithographic process. For example, the inventors have observed focus errors in extreme ultraviolet (EUV) lithographic processes resultant from erosion. At higher pattern densities, the inventors have determined that various step and scan defocus compensation methods are ineffective at resolving defocus.

The inventors have determined that by monitoring localized topography conditions, including localized erosion depth, at various portions of a semiconductor wafer in relation to performance of various semiconductor processes, and at various pattern densities at such portions across the wafer, improved local defocus detection can be achieved. As more data are received into the system for a semiconductor process (e.g. CMP), and for a fabrication tool, the values for detecting and determining local focus error continue to be refined and the accuracy of the system continues to improve.

The inventors have also determined that by monitoring local defocus errors induced by erosion at various portions of a semiconductor wafer during performance of photolithographic processes, including EUV lithography, improved local defocus compensation can be achieved. The inventors have observed that the surface height of a reticle used during performance of a photolithographic process can induce focus errors at an exposed wafer surface. For example, local defocus errors induced by erosion can be compensated for by varying the surface height of a reticle during performance of a photolithographic process. As more data are received into the system for a fabrication tool, the values for detecting and determining step height for a reticle, and compensating for local focus error, continue to be refined and the accuracy of the system continues to improve.

FIG. 1 is a flow chart illustrating a method 100 of compensating for local focus errors in a semiconductor process according to embodiments of the present disclosure. At block 110, an erosion level is estimated at a first portion of a semiconductor wafer based on a pattern density in a first portion of a design. In some embodiments, the estimated erosion level is for a predetermined layer selected for deposition over the first portion of the wafer. In some embodiments, a photolithographic system includes an exposure tool, a stepper and/or scanner, a photomask or reticle defining a pattern for a design, and an illumination and projection system for projecting the reticle pattern on to a surface of a semiconductor wafer.

In some embodiments, the photolithographic system will focus an image of the reticle pattern on to a patterned, photoresist layer deposited over a wafer, to cure a portion of the photoresist layer, while other parts of the photoresist layer remain uncured. The result is a pattern that can be used in formation of subsequent layers used in the semiconductor fabrication process. In some embodiments, a photolithographic system includes an EUV illumination and projection system. In an EUV illumination and projection system, an EUV source provides radiation at a wavelength between approximately 10 and 14 nanometers (nm). In some embodiments, an EUV source can be a laser-plasma source, a discharge plasma source, a synchotron (undulator), or any suitable EUV source.

The photomask or reticle in an EUV illumination and projection system is reflective and can include a multilayer coated substrate such as, for example, a substrate having a multilayer coating of many alternating layers of Molybdenum (Mo) and Silicon (Si) formed over the substrate. In other embodiments, a multilayer coating can include alternating layers of Mo and Beryllium (Be) formed over the substrate. A reticle substrate can be any suitable material including, but not limited to, a low thermal expansion material (LTEM) or quartz. In some embodiments, an EUV illumination and projection system receives EUV light reflected from the reticle (and carrying an image of the pattern of the design illuminated by the EUV source) and projects the patterned image from the reticle on to a photoresist-coated substrate (e.g. a photoresist coated semiconductor wafer.) In some embodiments, one or more multilayer coated mirrors can be used with the reticle to project the image of the pattern of the design on to the photoresist-coated substrate. In some embodiments, the EUV illumination and projection system is maintained under a high vacuum (e.g. $1 \times 10^{-5}$ Torr or less). A scanner or stepper system can be used such that exposure is performed while scanning the reticle stage and wafer stage and projecting the patterned image through an exposure slit.

Figure 5:
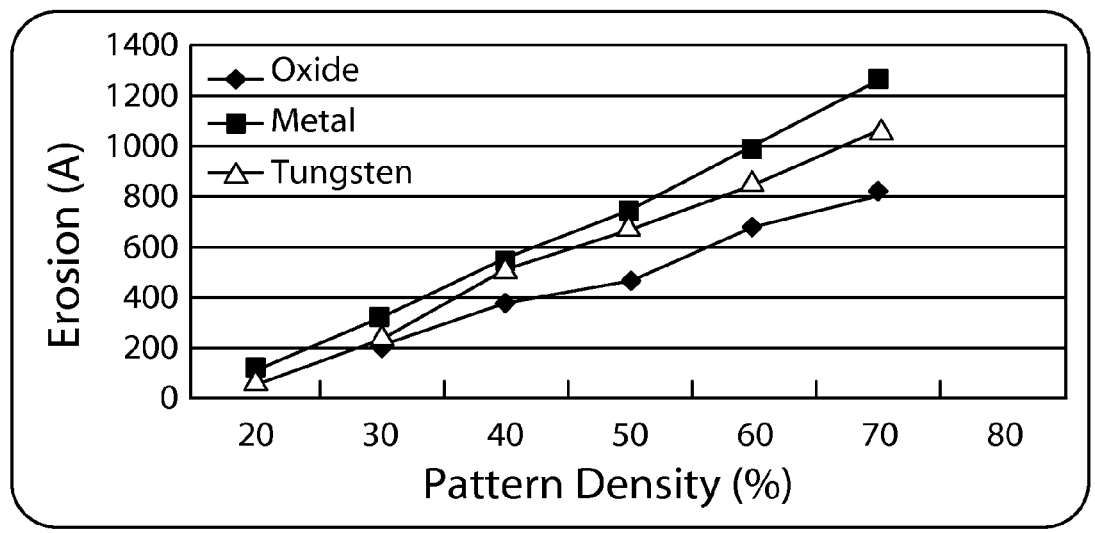
FIG. 5 is a diagram illustrating an example of a relationship between erosion depth and pattern density for a semiconductor process.

The wafer can be positioned in a wafer retaining device (e.g. an electrostatic chuck (ESC)) during photolithography exposure and post-exposure processes including CMP. The inventors have observed that as a pattern density increases for a portion of a pattern of a design that is projected on to a corresponding portion of the wafer, the erosion depth for a semiconductor process such as CMP also increases. With reference now to FIG. 5, a diagram illustrating an example of a relationship between erosion depth and pattern density for a semiconductor process is provided. In the illustrated example, a respective CMP process applied to a portion of a wafer corresponding to a portion of a design having a pattern density of 50% can induce an erosion level of 750 angstroms (A) in an oxide layer, 700 A in a metal layer, and 450 A in a contact layer for a respective fabrication tool. The inventors have observed that the relationship between erosion depth and pattern density exhibits process and product or tool dependent characteristics. In the illustrated example, an erosion depth in various layers formed over wafers subsequent to performance of a CMP process increases as the pattern density of the pattern transferred to the wafer increases. Erosion depth is illustrated as being determined at each of an oxide layer, a metal layer and a Tungsten contact layer in the example shown in FIG. 5. In some embodiments, a model of a predictable topography map relating erosion depth and pattern density can be determined for a process, product or tool, or combinations thereof, and used to compute an erosion level in various layers at various portions of a wafer based on the respective pattern densities at various portions of a pattern of a design. In other embodiments, the topography and/or erosion depth of a wafer can be determined using a suitable metrology method. In some embodiments, a combination of a metrology method and an empirical model of a predictable topography map can be used to determine the topography and/or erosion depth of a wafer.

Figure 6A:
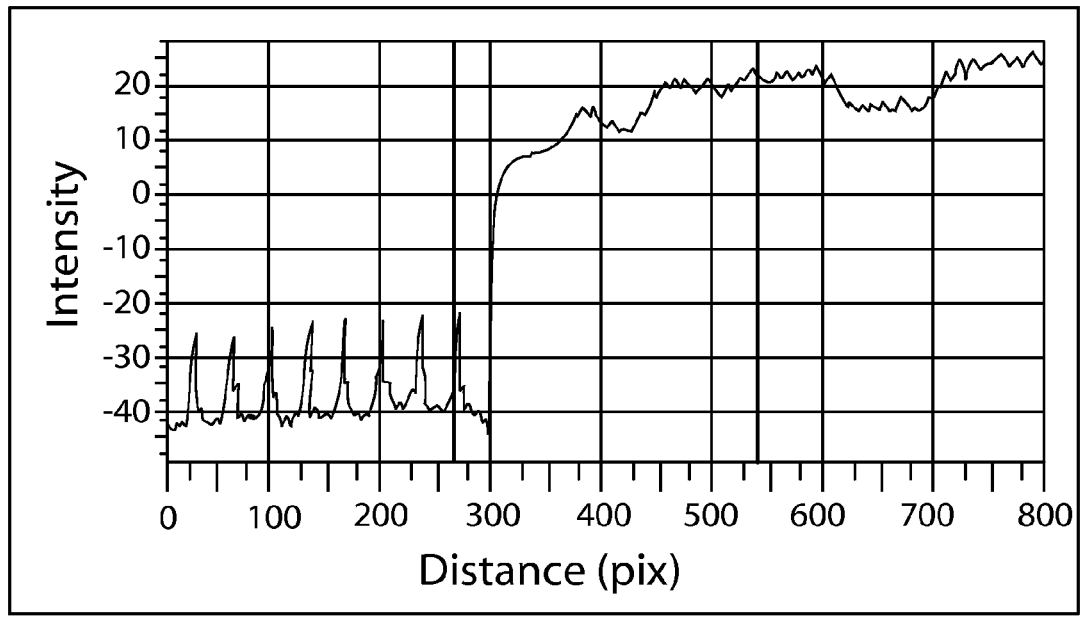
FIG. 6A is a diagram illustrating an example of a relationship between pattern density and relative surface height for a semiconductor process.
Figure 6B:
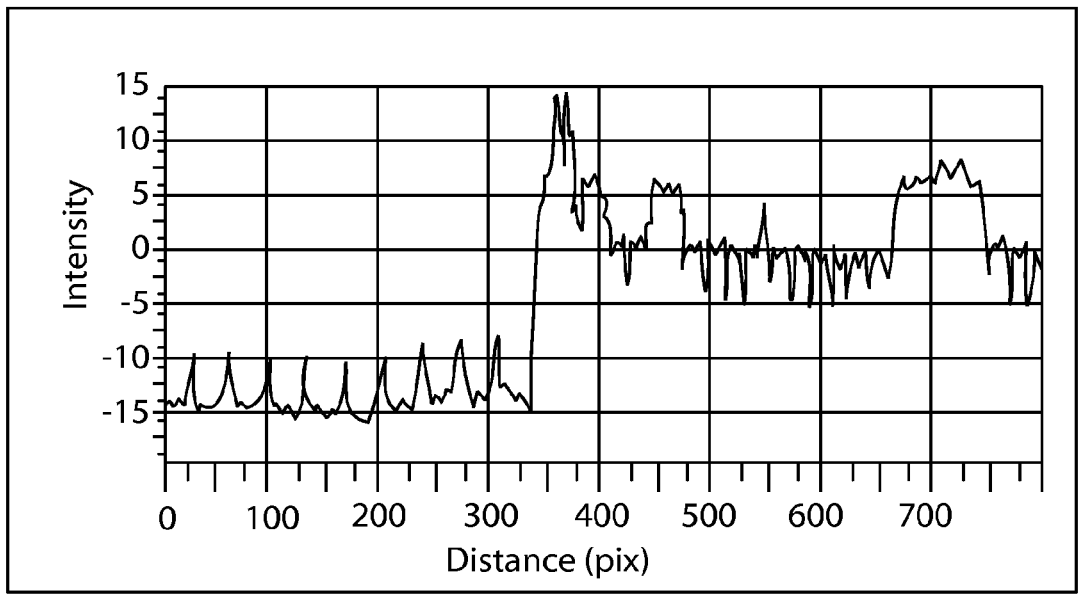
FIG. 6B is a diagram illustrating another example of a relationship between pattern density and relative surface height for a semiconductor process.

Referring now to FIGS. 6A and 6B, diagrams illustrating respective examples of a relationship between pattern density and relative surface height for a semiconductor process are provided. In the examples shown in FIGS. 6A and 6B, the erosion effect on the relative surface height of various portions of a pattern of a design transferred to corresponding portions of a wafer is illustrated. In the example shown in FIG. 6A, the portion of the pattern of the design between 0 and 300 pixels had a pattern density of approximately 48%. The remaining portions of the pattern of the design illustrated in FIG. 6A had a relatively low pattern density. In the example shown in FIG. 6B, the portion of the pattern of the design between 0 and 320 pixels had a pattern density of approximately 25%. The remaining portions of the pattern of the design illustrated in FIG. 6B had a respective pattern density lower than 25%. The inventors have observed that a portion of a pattern of a design having a higher pattern density will result in a greater erosion depth when the corresponding wafer portion undergoes a CMP process.

As illustrated in FIGS. 6A and 6B, the portion of the wafer corresponding to the portion of the design having a higher pattern density also exhibited higher topography after undergoing a CMP process. The observed pattern density to erosion depth relationship can also be expressed in terms of relative surface height across the wafer as shown in FIGS. 6A and 6B. In this manner, an erosion level at a first portion of a wafer can be estimated based on a pattern density of a corresponding first portion of a design as shown at block 110. As more data are received into the system for a semiconductor process (e.g. CMP), and for a fabrication tool, the values for estimating an erosion level for a portion of a wafer undergoing that process (e.g. CMP) continue to be refined and the accuracy of the system continues to improve.

Figure 2:
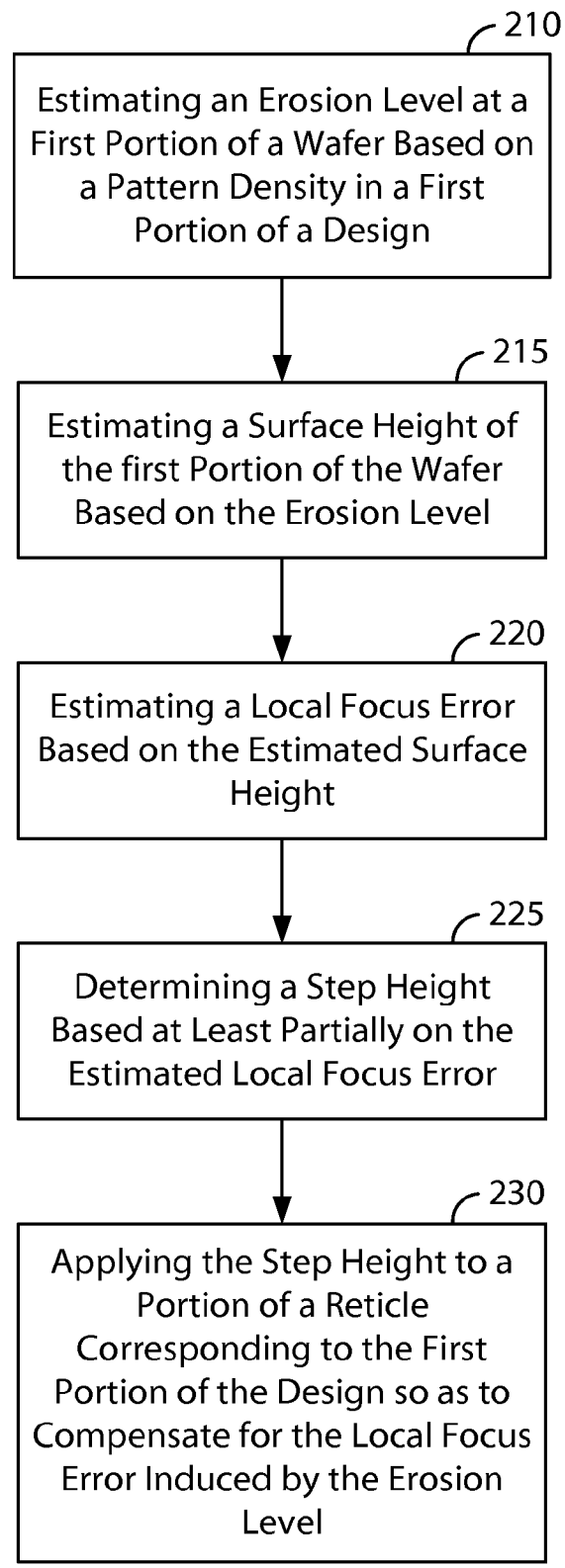
FIG. 2 is a flow chart illustrating a method of compensating for local focus errors in a semiconductor process according to some embodiments.

Referring now to FIG. 2, a flow chart illustrating a method of compensating for local focus errors in a semiconductor process according to some embodiments is provided. At block 210, an erosion level at a portion of the wafer is estimated based on a pattern density in a corresponding portion of the design. At block 215, a relative surface height of a portion of a wafer is estimated based on the estimated erosion level for that portion of the wafer. In some embodiments, at block 215, simulated topography data are generated for a wafer based on the pattern design, a fabrication tool, and a CMP process simulator having access to at least stored pattern density and erosion depth data. The simulated topography data can represent a plurality of data points (e.g. in x, y and z directions) that together represent a surface height of various portion of the wafer relative to a reference surface height. The variation in surface height observed across the various portions of the semiconductor wafer output from the CMP process simulator (e.g. FIGS. 6A and 6B) can be estimated based on inputs into the CMP process simulator including the estimated erosion level. In some embodiments, an erosion level at a second portion of the wafer is estimated based on a pattern density in a second portion of the design and to determine a surface height of a second portion of the wafer.

At block 220, a local focus error is estimated based on the estimated surface height. In some embodiments, the step of estimating a local focus error at block 215 includes estimating an image height at a first portion of a wafer corresponding to a pattern density and the estimated erosion level. An image height is a distance (z-direction) between the estimated surface height of the wafer (based on the pattern density and estimated erosion level) and a surface height of a reticle positioned within an EUV illumination and projection system. In some embodiments, a local focus error for a portion of a wafer is estimated by determining a focal plane that best fits the surface height data points for the portion of the wafer, and setting the focal plane such that the residual (error) is minimized. In some embodiments, determining the focal plane that best fits the surface height data points for a portion of the wafer can involve computing a best fit plane that minimizes the maximum distance from the points to the plane. In other embodiments, a best fit plane is determined that minimizes the sum of squared distances from the surface height data points to the plane. In some embodiments, a least squares fit across the surface height data points is used to determine the focal plane. In some embodiments, a least squares fit regression plane is determined across the surface height data points, in which case values in the x-direction and y-direction are fixed, and the measured local focus error is in the z-direction alone. In some embodiments, a local focus error for a portion of a wafer is estimated by determining a focal plane that best fits the estimated image height data points for the portion of the wafer. In other embodiments, a least squared fit regression plane is determined for the estimated image height data points. In some embodiments, a local focus error for a second portion of a wafer is estimated based on the estimated surface height for the second portion of the wafer.

At block 225, a step height to be applied to a reticle used in the photolithography process is estimated based at least partially on the estimated local focus error. The inventors have observed that a step height applied to a reticle that is used during performance of a photolithographic process induces local focus error compensation or correction at a surface of a wafer. Specifically, the inventors have determined that local focus errors induced by erosion can be compensated for, at least partially, by varying the surface height of a portion of a reticle during performance of a photolithographic process. In some embodiments, the local focus error estimated at block 220 can be compensated for by applying a step height to a portion of a reticle to induce a local focus error correction or compensation that can be used to resolve overall defocus, causing the portion of the wafer to lie within the focal plane of the lithographic tool.

A step height represents a surface height of a portion of the reticle relative to a reference surface height of the reticle. In some embodiments, the reference surface height of the reticle is a surface of the reticle that is illuminated by an EUV source during a photolithographic process. In some embodiments, the local focus error correction or compensation is provided as an input to a converter to determine the step height to be applied to the reticle. In some embodiments, a step height can be a positive step height such that a surface height of a portion of a reticle is increased relative to a direction toward an illumination light source. In other embodiments, a step height can be a negative step height such that a surface height of a portion of a reticle is decreased relative to a direction toward an illumination light source.

In some embodiments, a local focus error estimated at block 220 can be at least partially compensated using one or more step and/or scan leveling compensation methods. For example, in a step and/or scan leveling simulator, a surface height of a portion of a wafer can be simulated and leveling compensation (e.g. focus and/or tilt leveling compensation) can be performed to at least partially compensate for the local focus error induced by the erosion level at the portion of the wafer. In some embodiments, surface height measurement data can be simulated across a wafer, or a portion of the wafer; the data can be fitted using any suitable method, including a least squares or a max/min error method, to a leveling plane, a deviation can be determined, and a local focus error correction can be estimated from the deviation. In some embodiments, in a step and/or scan simulator, a slit size used in a scanning lithography tool can be modified and used as an input to the leveling simulator to at least partially compensate for the local focus error at the portion of the wafer. In some embodiments, a leveling simulator will output a local focus error correction that is available from a step and/or scan leveling compensation method based on empirical data stored and provided to the leveling simulator and the surface height of the portion of the wafer input into the leveling simulator.

In some embodiments, the leveling simulator will be unable to fully compensate for the local focus error induced by an erosion level at a portion of the wafer. In some embodiments, the leveling simulator will be unable to fully compensate for the local focus error induced by erosion at a portion of a wafer corresponding to a portion of a design having a pattern density in excess of a threshold pattern density. The leveling simulator can output a local focus error that is not correctable using step and/or scan leveling compensation methods, for example. In some embodiments, a local focus error output without correction by the leveling simulator can be compensated for by applying a step height to a portion of a reticle to induce a local focus error correction that can be used to resolve overall defocus, causing the portion of the wafer to lie within the focal plane of a lithographic tool.

Figure 7:
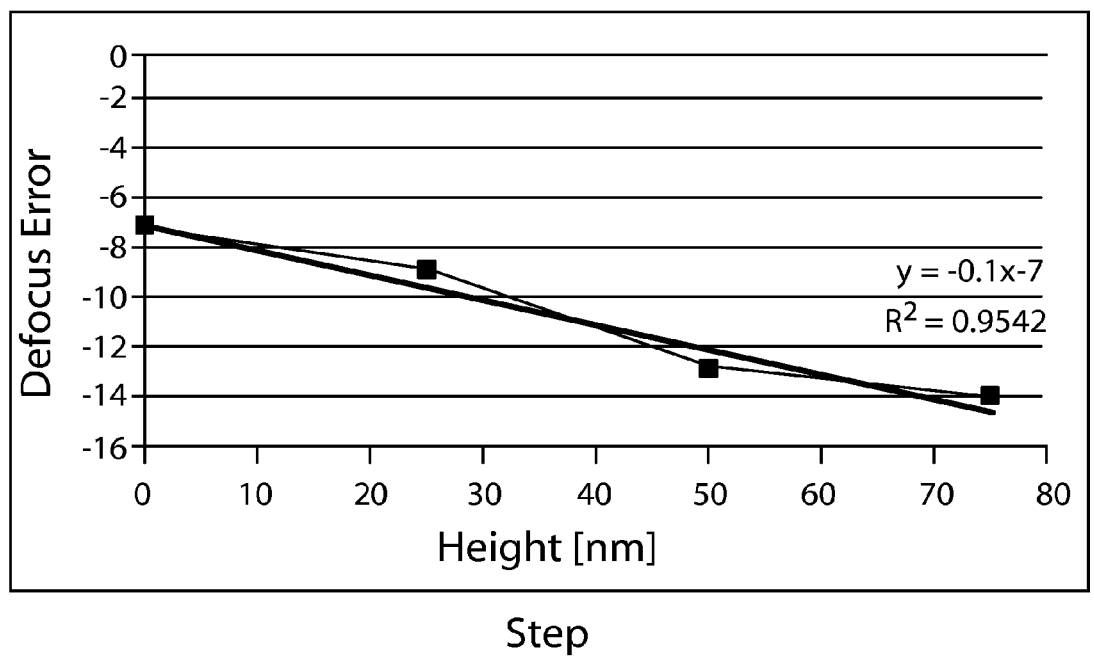
FIG. 7 is a diagram illustrating an example of a relationship between defocus error and step height for a semiconductor process.

FIG. 7 is a diagram illustrating an example of a relationship between defocus error and step height for a reticle used in a semiconductor process. In the illustrated example, the observed relationship between defocus error and step height for a reticle is provided for a fabrication tool. The inventors have observed that the relationship between local focus error or defocus error and step height is fabrication tool dependent. One of ordinary skill in the art can readily determine the corresponding relationship for any given fabrication tool.

In the illustrated embodiment, for example, a focus error of −10 nanometers (nm) can be induced by applying a step height of 30 nm to a reticle, and a focus error of −14 nm can be induced by applying a step height of 70 nm to a reticle, for a respective fabrication tool. As more data are received into the system for a given fabrication tool, the values for detecting and determining step height, and compensating for local focus error, continue to be refined, and the accuracy of the system continues to improve. In the illustrated example, a local focus error compensation or correction increases as the step height applied to the reticle surface increases. The induced topography on the reticle, formed by applying a step height to the reticle, is used to create a local focal error compensation or correction on the wafer to correct for the local focus error induced on the wafer by erosion from a semiconductor process (e.g. CMP). In some embodiments, a relationship between image height and step height for a reticle can be provided for a fabrication tool based on data received into the system. In some embodiments, a step height for a reticle can be determined by applying a conversion factor to an estimated image height for a portion of the wafer and the corresponding portion of the reticle. A conversion factor can be determined using image height and step height data received into the system for a respective fabrication tool, a respective fabrication process, or combinations thereof. For example, similar to other process dependent characteristics (e.g. film property, CMP recipe, etc.), a conversion factor can be determined for a respective fabrication process. In some embodiments, for example, the conversion factor is a value between 0.0625 and 0.125. In some embodiments, a step height for a second portion of a reticle corresponding to a second portion of a wafer is estimated based at least partially on the estimated local focus error for the second portion of the wafer.

At block 130 (FIG. 1) (block 230, FIG. 2), a step height is applied to a portion of a reticle corresponding to the first portion of the design so as to compensate for a local focus error induced by the erosion level. In some embodiments, a portion of a reticle is illuminated by an EUV source (carrying an image of the pattern of the design) and reflects the EUV light on to a corresponding portion of a photoresist coated wafer. The inventors have determined that local focus errors induced by erosion from CMP processes can prevent the image of the pattern of the design for the wafer portion from being projected within the focal plane of the lithography tool, especially in a case where a portion of a design has a high pattern density. By applying a first step height to a first portion of a reticle, a local focus error compensation can be induced such that the image of the pattern of the design for the wafer portion is projected within the focal plane of the lithography tool. In some embodiments, a second step height (which can be the same as or different from the first step height) is applied to a second portion of a reticle corresponding to a second portion of the design so as to compensate for a focus error induced by the erosion level at a corresponding second portion of a wafer.

Figure 3:
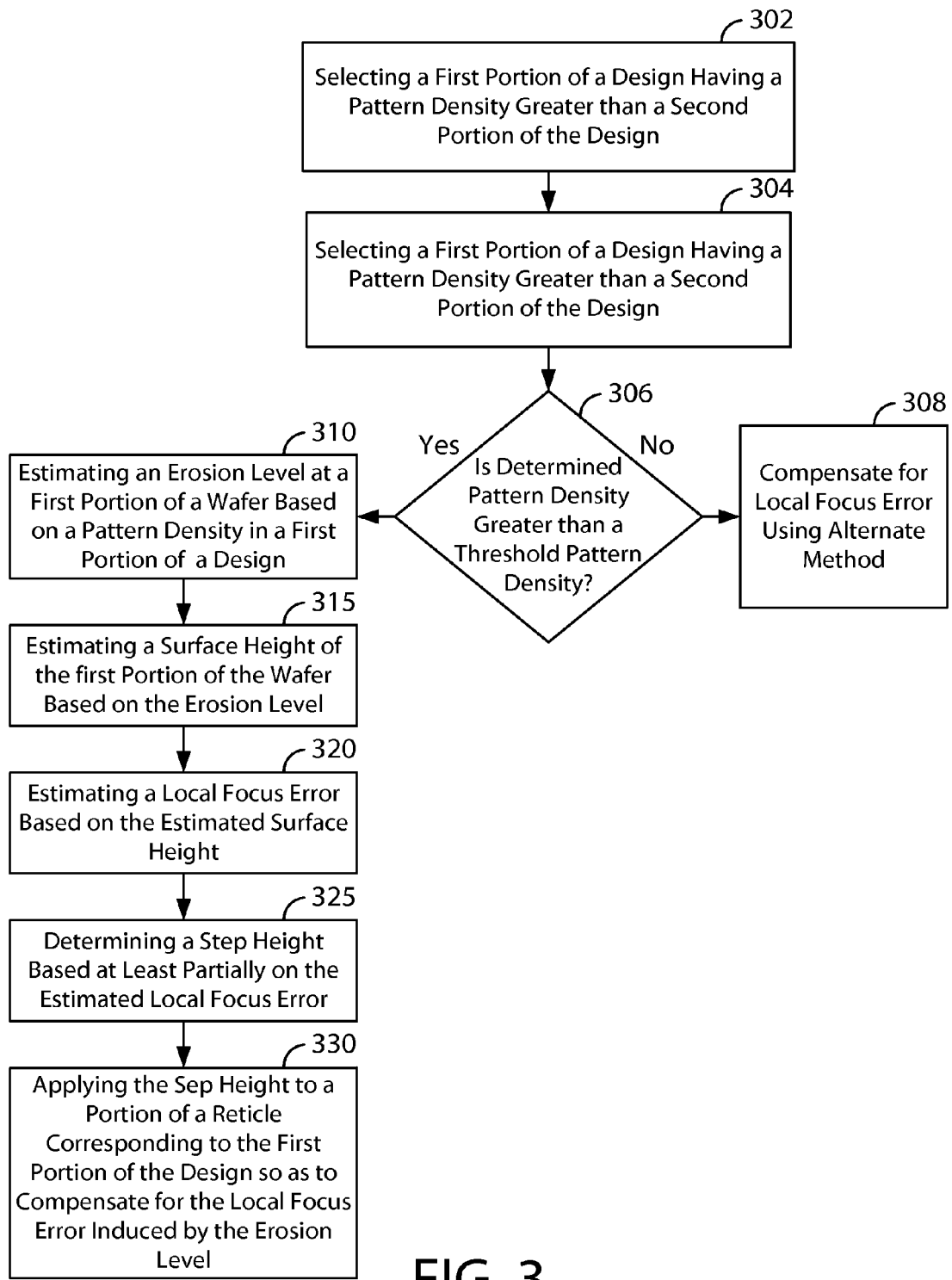
FIG. 3 is a flow chart illustrating a method of compensating for local focus errors in a semiconductor process according to embodiments of the present disclosure.

Referring now to FIG. 3, a flow chart illustrating a method of compensating for local focus errors in a semiconductor process according to embodiments of the present disclosure is provided. At block 302, a first portion of a design having a pattern density greater than a second portion of the design is selected. At block 304, the pattern density of the selected first portion of the design is determined. In some embodiments, a layout data file for the design stored in the system can be examined to determine the pattern density in the first portion. In some embodiments, a polysilicon critical dimension control (Poly CD Control), critical dimension control (CD Control), or any suitable method, can be used to determine the pattern density for the selected first portion of the design. In various embodiments, a pattern density for a selected first portion of the design can be computed before mask fabrication in a semiconductor process.

At block 306, the determined pattern density is compared to a threshold pattern density. In some embodiments, a threshold pattern density is a pattern density whose corresponding erosion depth, surface height and local focus error, can be compensated for using an alternative method, such as for example, a step and/or scan leveling compensation method. In some embodiments, a threshold pattern density is a pattern density having a corresponding erosion depth, surface height and local focus error that can be compensated for without applying a step height to a reticle used in the photolithographic process. For example, in some embodiments, a threshold pattern density is a pattern density whose corresponding local focus error can be compensated for using a scanner leveling method of focus error compensation. In some embodiments, a threshold pattern density is in a range greater than 0% and up to and including 20%. In other embodiments, a threshold pattern density is in a range greater than 0% and up to and including 10%.

At block 308, in the illustrated embodiment, if the determined pattern density is less than the threshold pattern density, then local focus error is compensated for without applying a step height to a reticle used in the photolithographic process. However, if the pattern density of the first portion of the design is determined to be greater than the threshold pattern density at block 308, a local focus error induced by the erosion level corresponding to the determined pattern density is compensated for by applying a step height to a portion of a reticle corresponding to the first portion of the design. In the illustrated embodiment, a local focus error induced by the erosion level corresponding to the determined pattern density is compensated for by performing the steps at blocks 310-330 as described above for blocks 210-230.

Figure 4:
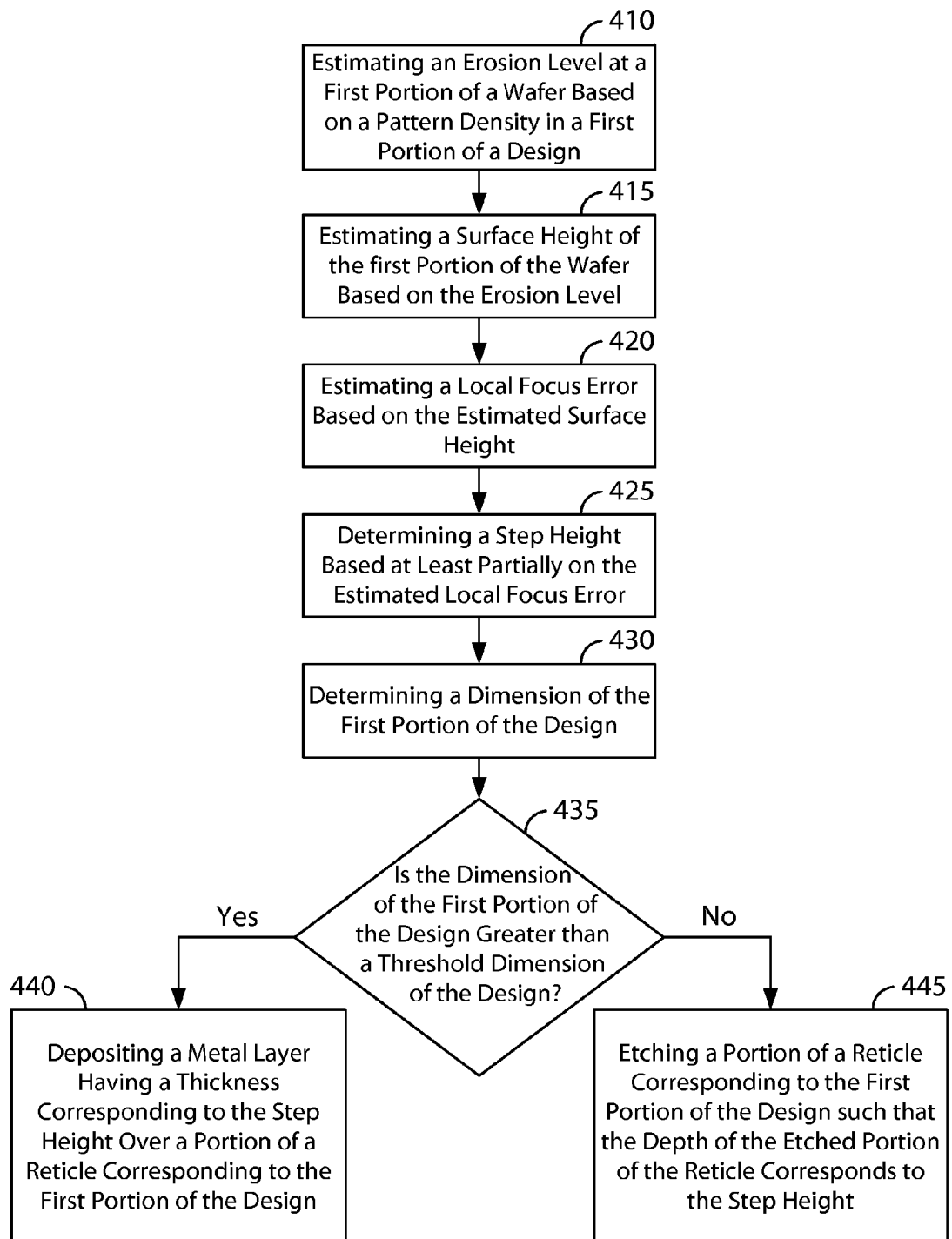
FIG. 4 is a flow chart illustrating a method of compensating for local focus errors in a semiconductor process according to some embodiments.

Referring now to FIG. 4, a flow chart illustrating a method of compensating for local focus errors in a semiconductor process according to some embodiments is provided. At block 410, an erosion level is estimated at a first portion of a wafer as described above for blocks 110 and 210. At block 415, a surface height of the first portion of the wafer is estimated as described above for block 215. At block 420, a local focus error is estimated as described above for block 220. At block 425, a step height is determined as described above for block 225. At block 430, a dimension of a first portion of a design corresponding to the first portion of the wafer is determined. In some embodiments, the dimension is a size of the first portion measured along a plane of the design. In other embodiments, the dimension is a surface area of the first portion measured along a plane of the design. The dimension can be any suitable dimension. The inventors have determined that a selection of the manner in which the step height (determined to compensate for the local focus error induced by an estimated erosion level at a portion of a wafer) should be applied to the reticle is design dependent. At block 435, the dimension of the first portion of the design is compared to a threshold dimension of the design. For example, a threshold dimension of the design can be a percentage of an overall dimension of the design (e.g. 25%, 50%, etc.). In another example, a threshold dimension of the design can be a percentage of an overall dimension of a predetermined portion of the design. In some embodiments, a size of the first portion is compared to a threshold size of the design. In some embodiments, a threshold size of the design is a percentage (e.g. 50%) of the overall size of the design.

In some embodiments, at block 435, a dimension of the first portion of the design is determined to be greater than a threshold dimension of the design. For example, a size of the first portion can be determined to be greater than 50% of the overall size of the design. At block 440, a metal layer having a thickness corresponding to a determined step height is deposited over a portion of the reticle corresponding to a portion of the wafer having an estimated erosion level so as to compensate for a local focus error induced by the erosion level. A metal layer can be deposited using a sputtering process, chemical vapor deposition process, or other process suitable for forming a metal layer. A metal layer can be formed from any suitable material including, but not limited to, Chromium Nickel (CrN), Silicon (Si), Molybdenum (Mo), etc.

For example, and referring now to FIGS. 8A-8G, sectional views of a reticle at various stages of processing illustrate a method of compensating for local focus errors in a semiconductor process according to some embodiments of the present disclosure. As illustrated in FIG. 8A, a reticle substrate 810 is provided. A reticle substrate 810 of any suitable material can be provided including, for example, a LTEM substrate or an ultra-low expansion (ULE) substrate. In the illustrated embodiment, a metal layer (e.g. a CrN layer, Si layer, Mo layer, etc.) 820 having a thickness corresponding to a determined step height is deposited over a first portion of the reticle. As shown in the illustrated embodiment, a surface of the reticle substrate 810 can have a conductive coating 805, for example a chromium nitride coating, formed thereon to allow for electrostatic chucking. In some embodiments, the step height can be determined based on an estimated local focus error for a first portion of a wafer corresponding to the first portion of the reticle.

Referring back to FIG. 4, at block 435, a dimension of the first portion of the design can be determined to be less than a threshold dimension of the design. At block 445, a portion of the reticle corresponding to a portion of the wafer having an estimated erosion level is etched such that the depth of the etched portion of the reticle corresponds to the determined step height so as to compensate for a local focus error induced by the erosion level. Etching of a portion of the reticle can be performed using any suitable method including, but not limited to, a wet etch (e.g. anisotropic wet etch using etchant HCl) or a dry etch (e.g. plasma etch using etchant $Cl_2$).

For example, and referring to FIGS. 9A-9G, various sectional views of a reticle at various stages of processing are provided illustrating a method of compensating for local focus errors in a semiconductor process according to some embodiments. In FIG. 9A, a portion 920 of the reticle substrate 910 (corresponding to a portion of a wafer having an estimated erosion level) is etched by any suitable method such that the depth of the etched portion 920 of the reticle substrate 910 corresponds to the determined step height so as to compensate for a local focus error induced by the erosion level. As described above, and as illustrated by FIGS. 8A and 9A, the inventors have determined that the selection of the manner in which the step height (determined to compensate for the local focus error induced by an estimated erosion level at a portion of a wafer) is applied to the reticle is dependent on the design selected for the photolithographic process. For example, the method illustrated in FIGS. 8A-8G is selected for a design where a portion of a layer of the design having an induced erosion level is determined (e.g. block 435) to be larger in size than the remaining portion of the layer of the design such that the layer of the design is determined to be predominantly eroded. Further by way of example, the method illustrated in FIGS. 9A-9G is selected for a design where a portion of a layer of the design having an induced erosion level is determined (e.g. block 435) to be smaller in size than the remaining portion of the layer of the design such that the layer of the design is determined to only be eroded in a localized region. A surface of the reticle substrate 910 can have a conductive coating 905 formed thereon to improve electrostatic chucking capabilities.

Referring to FIG. 8B (9B), a multilayer coating 830 is formed over the reticle substrate 810 (910) in the illustrated embodiment. The multilayer coating 830 (930) can be formed using any suitable method. The multilayer coating 830 (930) can also be formed using any suitable material. In some embodiments, the multilayer coating 830 (930) includes many alternating layers of Mo and Si formed over the reticle substrate 810 (910). For example, a multilayer coating 830 (930) can include forty (40) pairs of an alternating layer of Mo and Si. In other embodiments, the multilayer coating 830 (930) includes many alternating layers of Mo and Be formed over the reticle substrate 810 (910). For example, a multilayer coating 830 (930) can include fifty (50) pairs of an alternating layer of Mo and Be. The multilayer coating 830 (930), and each layer in each pair of the multilayer coating, can be any suitable thickness. For example, a pair of a multilayer coating 830 (930) can include a Mo layer of 4 nm and a silicon layer of 2 nm. In some embodiments, a capping layer (not shown) can be formed over the multilayer coating 830 (930) of any suitable material (e.g. Ruthenium (Ru)), to prevent oxidation.

With reference now to FIG. 8C, an absorber layer 840 (940) is formed over the multilayer coating 830 (930). The absorber layer 840 (940) can be formed using any suitable method and can be formed using any suitable material including, but not limited to, Tantalum Nitride (TaN), Tantalum Boron Nitride (TaBN), Tantalum Silicide (TaSi), Tantalum Silicon Nitride (TaSiN), etc. The absorber layer 840 (940) can be formed at any suitable thickness. For example, the absorber layer can be 50-60 nm in thickness. In some embodiments, a capping layer (not shown) can be formed over the absorber layer 840 (940) of any suitable material, (e.g. an anti-reflective oxide). As shown in FIG. 8D, a photoresist layer 850 (950) can be formed over the absorber layer 840 (940) by any suitable method (e.g. spin coating). In some embodiments, the photoresist coated reticle is soft baked to drive off excess photoresist solvent.

In FIG. 8E, the photoresist layer 850 (950) is patterned using any suitable method (e.g. electron beam patterning) corresponding to the pattern of the design. In some embodiments, a post-exposure bake (PEB) is performed on the reticle and the remaining photoresist 850 (950) is developed by any suitable method (e.g. using an aqueous base solution such as tetramethyl ammonium hydroxide (TMAH)). Referring now to FIG. 8F, exposed portions of the absorber layer 840 (940) are etched using any suitable method (e.g. a wet etch or a dry etch). In FIG. 8G, residual photoresist 850 (950) is removed using any suitable method (e.g. wet stripping or ashing). FIGS. 8A-8G and 9A-9G illustrate the effect of the selection of the manner of application of the determined step height to the portion of the reticle corresponding to the portion of the wafer having an estimated erosion level.

In some embodiments, steps of the method can be implemented by a general purpose computer programmed in accordance with the principals discussed herein. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features can be described above as acting in certain combinations and even initially claimed as such, one or more features from a claimed combination can in some cases be excised from the combination, and the claimed combination can be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the embodiments described above should not be understood as requiring such separation in all embodiments, and it should be understood that the described program components and systems can generally be integrated together in a single software product or packaged into multiple software products.

Processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Figure 10:
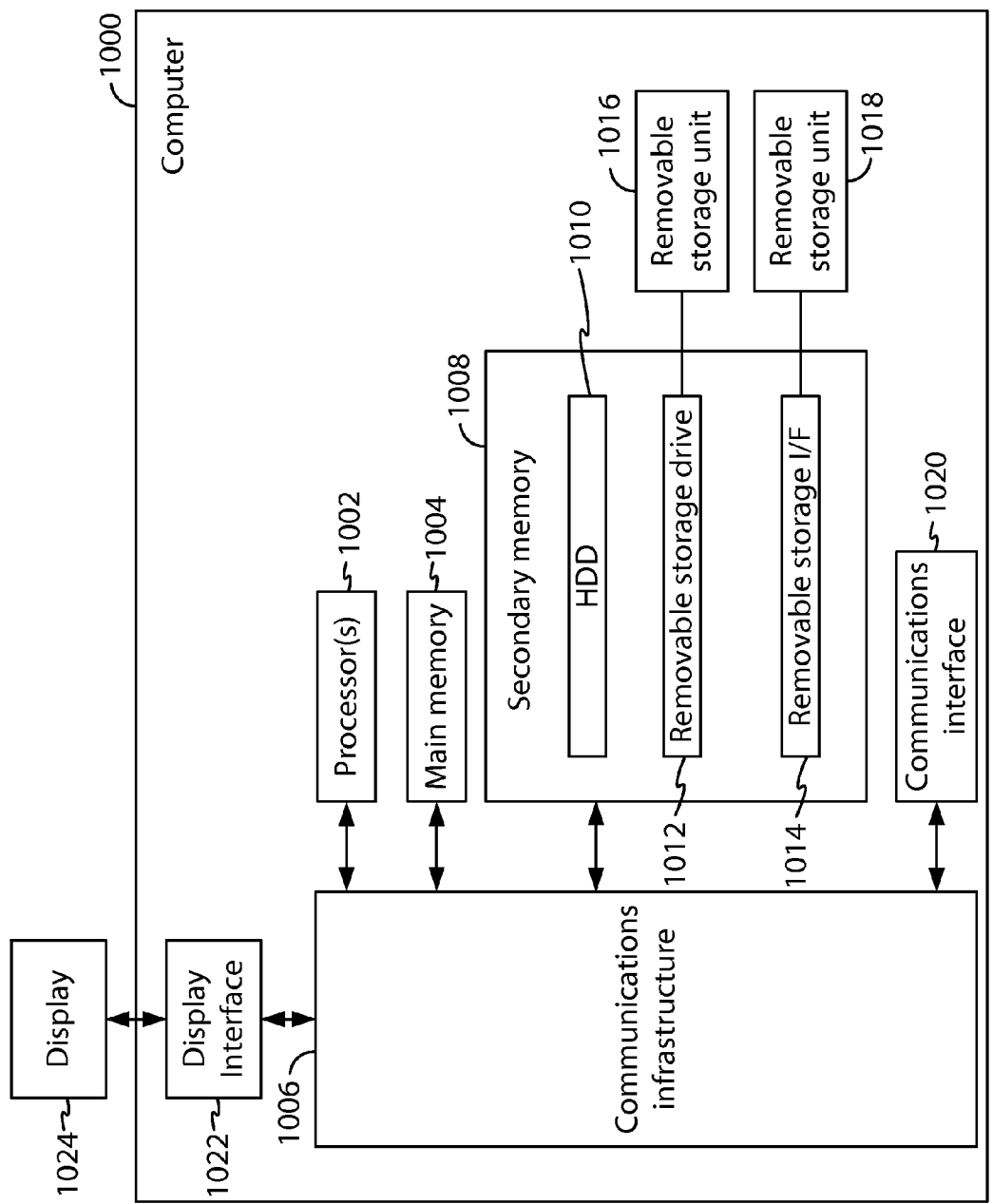
FIG. 10 is a diagram of an illustrative example of an architecture of a computer processing unit according to some embodiments.

A diagram of an illustrative example of an architecture of a computer processing unit according to some embodiments is shown in FIG. 10. Embodiments of the subject matter and the functional operations for various steps of processes described in this specification can be implemented in electronic circuitry, or in computer firmware, or hardware, including the structures disclosed in this specification and their equivalents, or in combinations of one or more of them. Embodiments of the subject matter described in this specification can be implemented as one or more computer program products, i.e., one or more modules of computer program instructions encoded on a non-transitory, tangible machine readable storage medium for execution by, or to control the operation of, data processing apparatus. The non-transitory, tangible storage medium can be a non-transitory computer readable storage medium. The computer readable medium can be a machine-readable storage device, a machine-readable storage medium, a memory device (e.g., flash or random access memory), a hard disk drive, a tape drive, an optical drive (such as, but not limited to CDROM, DVD, or BDROM) or the like, or a combination of one or more of them.

At least a portion of the system for compensating for local focus errors in a semiconductor process described herein can be implemented in computer processing unit 1000 and specifically in software and where results (e.g. estimated erosion levels, estimated surface heights, estimated local focus errors, topography simulations, CMP process simulations, determined step heights, estimated image heights, etc.) can be presented to system operator on a graphical user interface (GUI) on a display device such as a computer monitor 1024 (1026) or other display device. Embodiments of the subject matter described in this specification can be implemented on a computer 1000 having a keyboard, pointing device, e.g., a mouse or a trackball, by which the operator can provide input to the computer. Other kinds of devices can be used to provide for interaction with an operator as well; for example, input from the operator can be received in any form, including acoustic, speech, or tactile input. In some embodiments, the computer system 1000 includes functionality providing for various components of the systems for compensating for local focus errors in semiconductor processes and steps of the corresponding methods as described, for example, in FIGS. 1-4, 8-9 and 11.

As illustrated in FIG. 10, computer processing unit 1000 can include one or more processors 1002. The processor 1002 is connected to a communication infrastructure 1006 (e.g., a communications bus, cross-over bar, or network). Computer processing unit 1000 can include a display interface 1022 that forwards graphics, text, and other data from the communication infrastructure 1006 (or from a frame buffer not shown) for display on the display unit 1024.

Computer processing unit 1000 can also include a main memory 1004, such as a random access memory (RAM), and a secondary memory 1008. The secondary memory 1008 can include, for example, a hard disk drive (HDD) 1010 and/or removable storage drive 1012, which can represent a floppy disk drive, a magnetic tape drive, an optical disk drive, or the like. The removable storage drive 1012 reads from and/or writes to a removable storage unit 1016. Removable storage unit 1016 can be a floppy disk, magnetic tape, optical disk, or the like. As will be understood, the removable storage unit 1016 can include a computer readable storage medium having stored therein computer software and/or data. Computer readable storage media suitable for storing computer program instructions and data include all forms data memory including nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM, DVD-ROM, and BDROM disks. The processor 1002 and the memory 1004 can be supplemented by, or incorporated in, special purpose logic circuitry.

In alternative embodiments, secondary memory 1008 can include other similar devices for allowing computer programs or other instructions to be loaded into computer processing unit 1000. Secondary memory 1008 can include a removable storage unit 1018 and a corresponding interface 1014. Examples of such removable storage units include, but are not limited to, USB or flash drives, which allow software and data to be transferred from the removable storage unit 1018 to computer processing unit 1000.

Computer processing unit 1000 can also include a communications interface 1020. Communications interface 1020 allows software and data to be transferred between computer processing unit 1000 and external devices. Examples of communications interface 1020 can include a modem, Ethernet card, wireless network card, a Personal Computer Memory Card International Association (PCMCIA) slot and card, or the like. Software and data transferred via communications interface 1020 can be in the form of signals, which can be electronic, electromagnetic, optical, or the like that are capable of being received by communications interface 1020. These signals can be provided to communications interface 1020 via a communications path (e.g., channel), which can be implemented using wire, cable, fiber optics, a telephone line, a cellular link, a radio frequency (RF) link and other communication channels.

The computer program products provide software to computer processing unit 1000. Computer programs (also referred to as computer control logic) are stored in main memory 1004 and/or secondary memory 1008. Computer programs can also be received via communications interface 1020. Such computer programs, when executed by a processor, enable the computer system 1000 to perform features of the method discussed herein. For example, main memory 1004, secondary memory 1008, or removable storage units 1016 or 1018 can be encoded with computer program code for performing various steps of the processes described in FIGS. 1-4 and 8-9.

In an embodiment implemented using software, the software can be stored in a computer program product and loaded into computer processing unit 1000 using removable storage drive 1012, hard drive 1010, or communications interface 1020. The software, when executed by a processor 1002, causes the processor 1002 to perform the functions of various steps of the methods described herein. In another embodiment, various steps of the methods can be implemented primarily in hardware using, for example, hardware components such as a digital signal processor comprising application specific integrated circuits (ASICs). In yet another embodiment, the method is implemented using a combination of both hardware and software.

Various embodiments can be implemented in a computing system that includes a back end component, e.g., as a data server, or that includes a middleware component, e.g., an application server, or that includes a front end component, e.g., a computer having a GUI or a Web browser through which an operator can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

Figure 11:
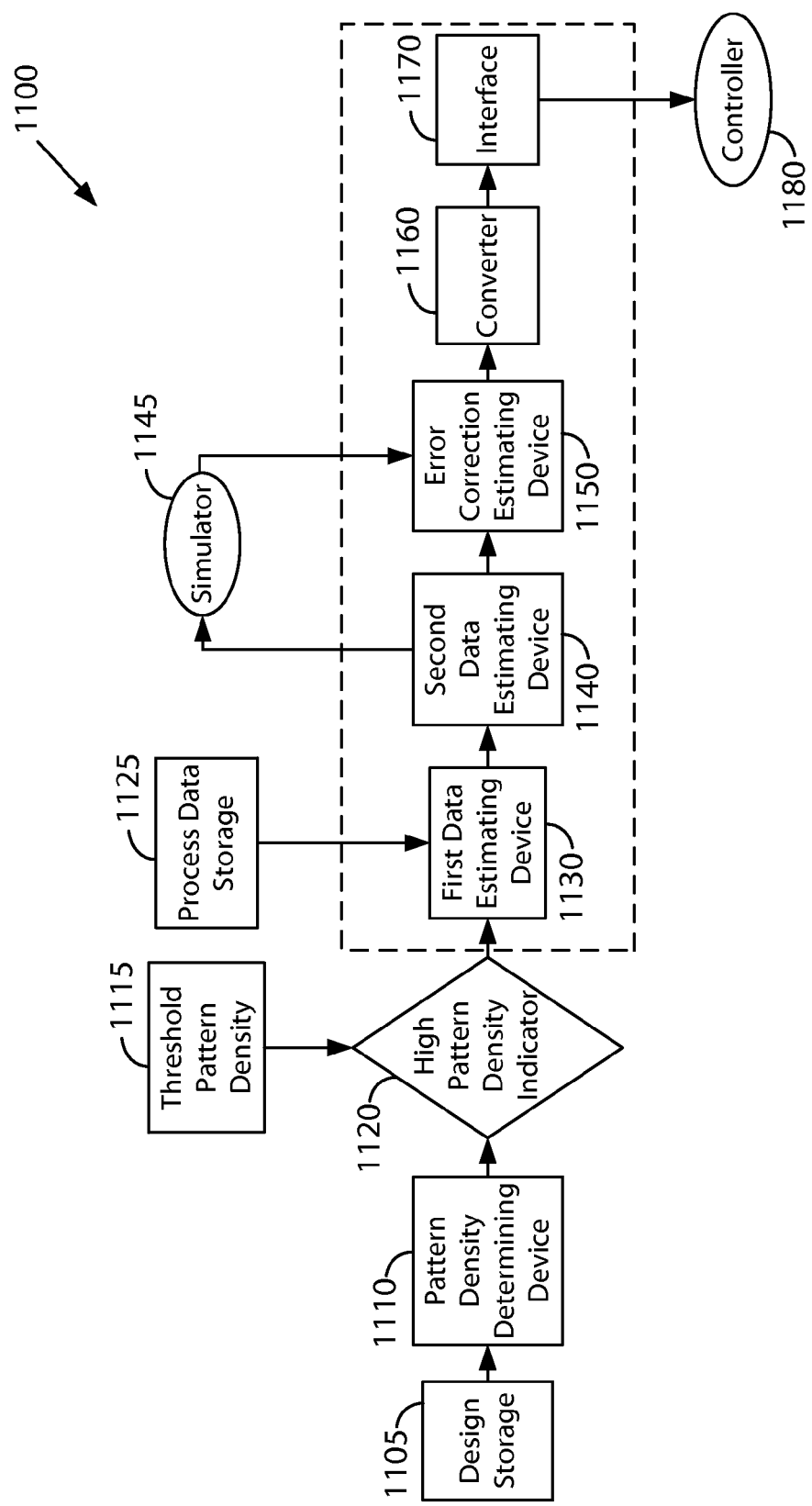
FIG. 11 is an example of a system of compensating for local focus errors in a semiconductor process according to embodiments of the present disclosure.

Referring now to FIG. 11, an example of a system 1100 of compensating for local focus errors in a semiconductor process is shown. A design storage 1105 is provided to store design information, including layout design information, for various integrated circuits. In some embodiments, for example, design storage 1105 can include, but is not limited to, a storage medium configured to store data representing at least one integrated circuit design, a removable storage unit 1016 (1018), a flat file or a database. In the illustrated embodiment, a pattern density determining device 1110 is provided to determine a local pattern density at a portion of a selected design. A high pattern density indicator device 1120 is provided and receives an input from the pattern density determining device 1110 and an input from a threshold pattern density input 1115. The high pattern density indicator device 1115 is provided to indicate satisfaction of a condition that a portion of a selected design has a pattern density that is greater than a threshold pattern density. In some embodiments, system 1100 can include a design portion selecting device (not shown) to select a portion of the design having a determined pattern density greater than a threshold pattern density.

The system 1100 includes a first data estimating device 1130 to estimate an erosion level at a portion of a wafer corresponding to a portion of the selected design if a pattern density at the portion of the design is greater than a stored threshold pattern density. As shown in the illustrated embodiment, the first data estimating device 1130 receives an input from the high pattern density indicator 1020 and a process data storage 1025. In some embodiments, for example, process data storage 1125 can include, but is not limited to, a storage medium configured to store data corresponding to at least one semiconductor process (e.g. CMP) and/or at least one fabrication tool, a removable storage unit 1016 (1018), a flat file or a database. In some embodiments, process data storage 1125 can include a storage medium configured to store CMP process data (e.g. erosion level and pattern density data) for at least one integrated circuit design and corresponding semiconductor wafer). For example, process data storage 1125 can include a storage medium configured to store erosion levels for a plurality of CMP processes for a plurality of fabrication tools for a plurality of pattern densities for a plurality of semiconductor wafers. A second data estimating device 1140 is provided to estimate a surface height of the portion of the wafer based on the erosion level input received from the first data estimating device 1130.

The system 1100 includes an error correction estimating device 1150 to estimate a local focus error correction at the portion of the wafer based at least partially on the surface height of the portion of the wafer input received from the second data estimating device 1140. In the illustrated embodiment, the error correction estimating device 1050 receives an estimated surface height input from the second data estimating device 1140 and an input from simulator 1145. In some embodiments, simulator 1145 receives an estimated surface height input from the second data estimating device 1140 to simulate a plurality of leveling conditions at the surface height of the portion of the wafer. In some embodiments, simulator 1145 receives an input from a storage medium (not shown) that is configured to store a plurality of empirical data including, for example, leveling compensation data at a plurality of surface heights for a plurality of semiconductor wafers corresponding to at least one scanner and/or stepping device associated with at least one fabrication tool. In some embodiments, simulator 1145 outputs a local focus error correction that is available from a step and/or scan leveling compensation method based on empirical data stored in a storage medium (not shown) and provided to simulator 1145 and the surface height of the portion of the wafer input into simulator 1145. In some embodiments, simulator 1145 does not fully compensate for the local focus error induced by an erosion level at a portion of the wafer. In some embodiments, simulator 1145 does not fully compensate for the local focus error induced by erosion at a portion of a wafer corresponding to a portion of a design having a pattern density in excess of a threshold pattern density output from threshold pattern density input 1115. In some embodiments, simulator 1145 can output a local focus error to error correction estimating device 1150 that is not fully correctable by solely using, for example, step and/or scan leveling compensation methods.

In some embodiments, error correction estimating device 1150 receives inputs from second data estimating device 1140 and simulator 1145 and outputs a compensated local focus error using any suitable method. In some embodiments, the compensated local focus error output from error correction estimating device 1150 is a local focus error that is not correctable solely by the simulator 1145 alone. In the illustrated system, a converter 1160 is provided to convert a compensated local focus error to a step height based on the compensated local focus error correction output from error correction estimating device 1150. In some embodiments, converter 1160 receives an input from a storage medium (not shown) that stores empirical data. For example, converter 1160 can receive an input from a storage medium (not shown) that stores empirical data including, for example, defocus error data, reticle step height data, and/or image height data for one or more fabrication tools. In some embodiments, a storage medium (not shown) can store data including, for example, one or more respective conversion factors to convert image height data to step height data for one or more respective fabrication tools. In some embodiments, the converter 1160 includes a respective table of defocus errors and step heights for a plurality of error values in the expected range, for each tool. In other embodiments, the converter includes a respective set of polynomial coefficients for each of a plurality of fabrication tools; for a given tool, a step height value can be determined by calculating the value of the polynomial function for a given defocus error using the respective coefficients.

System 1100 includes an interface 1170 to apply the step height to a controller 1180 to control a mask process by applying the step height to a portion of a reticle corresponding to the first portion of the design. The interface 1170 can update a reticle step height or keep a reticle step height the same for a CMP process and/or for a fabrication tool based on inputs established for the system 1100.

One embodiment provides a method of compensating for local focus errors in a semiconductor process. An erosion level is estimated at a first portion of a wafer based on a pattern density in a first portion of a design. The embodiment also includes applying a step height to a portion of a reticle corresponding to the first portion of the design so as to compensate for a local focus error induced by the erosion level.

Another embodiment provides a method of compensating for local focus errors in a semiconductor process. The embodiment includes providing a reticle and applying, at a first portion of the reticle, a step height based on an estimated local focus error for a first portion of a wafer corresponding to the first portion of the reticle. The embodiment also includes forming a multilayer coating is formed over the reticle and forming an absorber layer over the multilayer coating. A photoresist is formed over the absorber layer. The embodiment further includes patterning the photoresist, performing an etch of the absorber layer and removing residual photoresist.

A further embodiment provides a system of compensating for local focus errors in a semiconductor process including a first data estimating device to estimate an erosion level at a first portion of a wafer corresponding to a first portion of the design if a pattern density at the first portion of the design is greater than a stored threshold pattern density. A second data estimating device is included in the embodiment of the system to estimate a surface height of the first portion of the wafer based on the erosion level. The embodiment also includes an error correction estimating device to estimate a local focus error correction at the first portion of the wafer based on the surface height. A converter is included to convert a compensated local focus error to a step height based on the local focus error correction. The embodiment further includes an interface to apply the step height to a controller to control a mask process by applying the step height to a portion of a reticle corresponding to the first portion of the design.

While various embodiments have been described, it is to be understood that the embodiments described are illustrative only and that the scope of the subject matter is to be accorded a full range of equivalents, many variations and modifications naturally occurring to those of skill in the art from a perusal hereof.

What we claim is:

1. A method of compensating for local focus errors in a semiconductor process, comprising:
   estimating a correlation between a plurality of errors in focusing on a plurality of wafer surface portions within a focal plane of a lithography tool and a plurality of reticle step heights;
   estimating a local erosion level across a first wafer surface portion based on a density of a pattern to be projected from a first reticle surface portion across the first wafer surface portion, the first wafer surface portion having predetermined planar dimensions and wherein the predetermined planar dimensions are less than the planar dimensions of the entire wafer surface; and etching or depositing a material across the first reticle surface portion to a reticle step height determined based on the estimated correlation and the estimated local erosion level so as to compensate for an error in focusing on the first wafer surface portion within the focal plane of the lithography tool induced by the local erosion level.

2. The method of claim 1, wherein the step of etching or depositing is performed if the density is greater than a threshold density of a pattern to be projected from a reticle surface portion having the same planar dimensions as the first reticle surface portion.

3. The method of claim 1, wherein the step of estimating a local erosion level is further based on the type of material to be formed across the first wafer surface portion.

4. The method of claim 3, further comprising:
estimating a local image height across the-first wafer surface portion corresponding to the density and the estimated local erosion level; and
estimating the error in focusing on the first wafer surface portion within the focal plane of the lithography tool based on the estimated local image height.

5. The method of claim 4, further comprising:
determining the reticle step height using the estimated correlation and the estimated error.

6. The method of claim 2, wherein the threshold density is in a range greater than 0% and up to and including 20%.

7. The method of claim 2, wherein the threshold density is in a range greater than and including 25% and less than 100%.

8. The method of claim 1, further comprising determining a dimension of the first reticle surface portion; and
comparing the determined dimension of the first reticle surface portion to a threshold dimension of the reticle surface.

9. The method of claim 8, wherein the dimension comprises a size of the first reticle surface portion and the threshold dimension comprises a ratio of the size of the first reticle surface portion and the overall size of the reticle surface.

10. The method of claim 8, wherein the dimension comprises a size of the first reticle surface portion and the threshold dimension comprises a ratio of the size of the first reticle surface portion and the size of a second reticle surface portion larger than and including the first reticle surface portion.

11. The method of claim 1, wherein the semiconductor wafer process is a predetermined chemical-mechanical planarization (CMP) process.

12. The method of claim 1, further comprising:
estimating a local erosion level across a second wafer surface portion based on a density of a pattern to be projected from a second reticle surface portion across the second wafer surface portion, the second wafer surface portion having predetermined planar dimensions and wherein the predetermined planar dimensions of the second wafer surface portion are less than the planar dimensions of the entire wafer surface; and
etching or depositing a material across the second reticle surface portion to a reticle step height determined based on the estimated correlation and the estimated local erosion level across the second wafer surface portion so as to compensate for an error in focusing on the second wafer surface portion within the focal plane of the lithography tool induced by the local erosion level.

13. The method of claim 1, further comprising:
providing a reticle comprising the first reticle surface portion.

14. The method of claim 8, wherein the step of etching or depositing further comprises depositing a metal layer having a thickness across the first reticle surface portion corresponding to the reticle step height if the determined dimension is greater than the threshold dimension.

15. The method of claim 8, wherein the step of etching or depositing further comprises etching the first reticle surface portion such that the depth across the etched first reticle surface portion corresponds to the reticle step height if the determined dimension is less than the threshold dimension.

16. The method of claim 13, further comprising:
forming a multilayer coating over the first reticle surface portion;
forming an absorber layer over the multilayer coating;
forming a photoresist over the absorber layer;
patterning the photoresist;
performing an etch of the absorber layer; and
removing residual photoresist.

* * * * *